United States Patent [19]

Patry et al.

[11] 4,194,146

[45] Mar. 18, 1980

[54] DEVICE FOR CONTROLLING THE CHARGING AND DISCHARGING OF A STORAGE BATTERY

[75] Inventors: Eric Patry, Nogent; Daniel Lelaidier, Neuilly, both of France

[73] Assignee: Saft-Societe des Accumulateurs Fixes et de Traction, Romainville, France

[21] Appl. No.: 823,659

[22] Filed: Aug. 11, 1977

[30] Foreign Application Priority Data

Aug. 11, 1976 [FR] France .................. 76 24473

[51] Int. Cl.² .............. H02J 7/04; G01R 11/66
[52] U.S. Cl. ..................... 320/44; 320/48; 324/433; 324/76 A
[58] Field of Search ............ 320/39, 29, 40, 43, 320/44, 45, 48; 324/29.5, 76 A; 340/636

[56] References Cited

U.S. PATENT DOCUMENTS

| | | | |
|---|---|---|---|
| 3,564,382 | 2/1971 | King et al. | 320/44 X |
| 3,872,457 | 3/1975 | Ray et al. | 340/636 X |
| 3,889,172 | 6/1975 | Lelaidier et al. | 320/48 X |
| 3,895,284 | 7/1975 | Schweizer et al. | 320/48 |
| 3,898,548 | 8/1975 | Perelle et al. | 320/48 |

Primary Examiner—Robert J. Hickey
Attorney, Agent, or Firm—Kenyon & Kenyon

[57] ABSTRACT

A device for controlling the charging and discharging of a storage battery has an input to which there is applied an input voltage proportional to the magnitude and sign of the current flowing through the battery. The input voltage is amplified and integrated to provide an integral which is an image of the state of charge of the battery. In this invention the input voltage is converted to a pulse train whose frequency is proportional to the magnitude of the input voltage and the pulses are added or subtracted according to its sign. The pulse total forms the said image of the state of charge of the battery.

9 Claims, 6 Drawing Figures

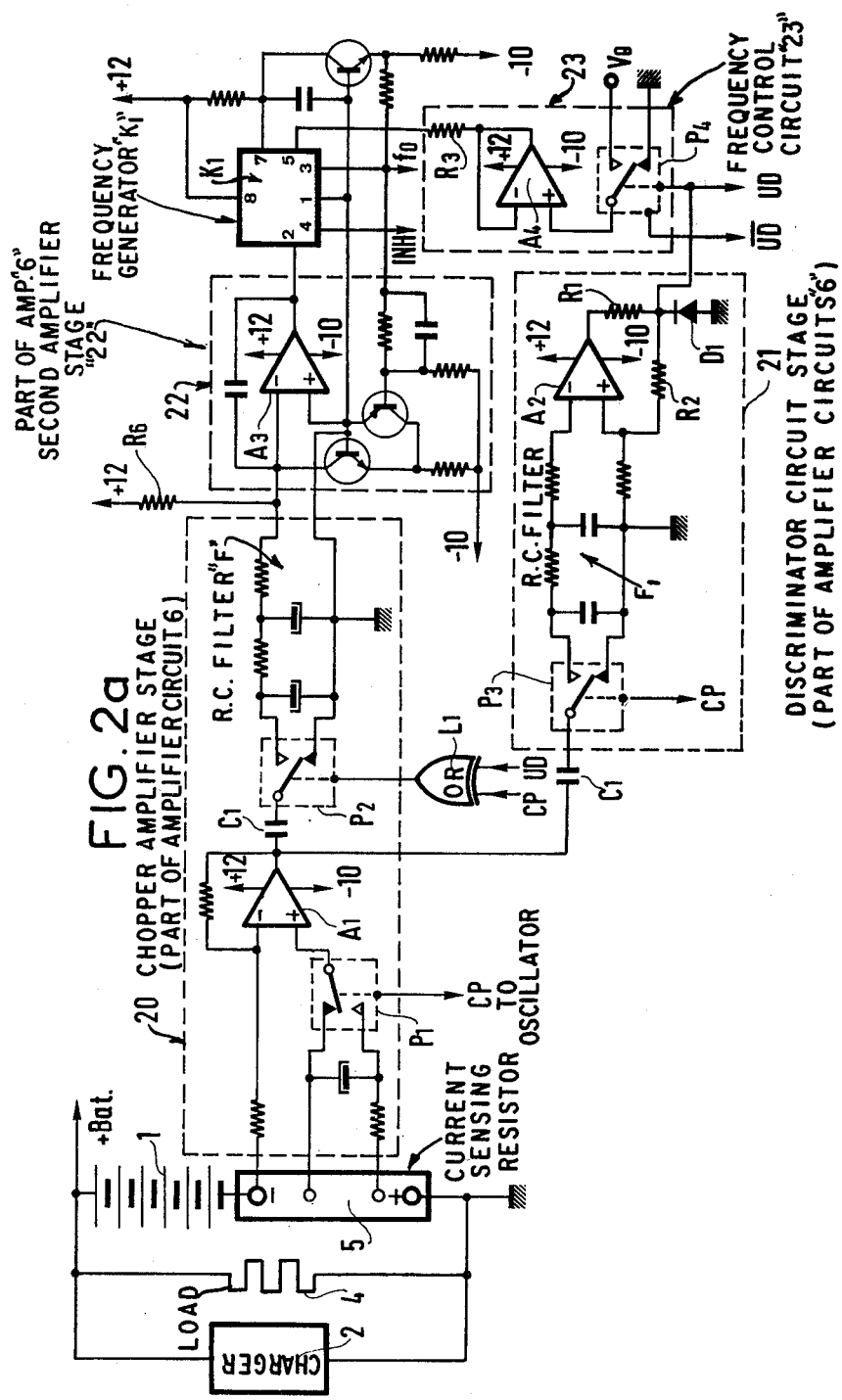

DEVICE FOR CONTROLLING THE CHARGING AND DISCHARGING OF A STORAGE BATTERY

BRIEF SUMMARY AND BACKGROUND OF INVENTION

The invention relates to the charging and discharging of storage batteries. It is particularly concerned with a device which continuously monitors the state of charge in terms of the quantities of electrical energy charged and discharged.

An object and feature of the invention is a device which is characterized in that it comprises:

a current sensing resistor connected in series with the battery, the voltage across the said resistor being referred to hereinafter as the input voltage;

at least one chopper amplifier stage providing an amplified voltage with an absolute value proportional to said input voltage;

a voltage to frequency converter providing a train of pulses at a frequency proportional to the absolute value of said amplified voltage; and a counter responsive to said pulses and to the polarity of the input voltage, the counter being incremented or decremented by said pulses in accordance with the polarity of said input voltage, the state of a logic output of the counter being representative of the state of charge of the battery.

The counter is more accurate and reliable than devices using current integration. In combination with the chopper amplifier stage, it also increases the dynamic range of the battery discharge currents that can be measured. The counter can record very high frequency pulses, corresponding to very high discharge currents, while the chopper amplifier stage eliminates background noise and enables very small discharge currents to be detected.

Other features of the invention will become apparent from the following description, which is given by way of non-limiting example and with reference to the accompanying drawings, in which:

FIGS. 2a and 2b are circuit diagrams of the device shown in FIG. 1; and

Figure 1:
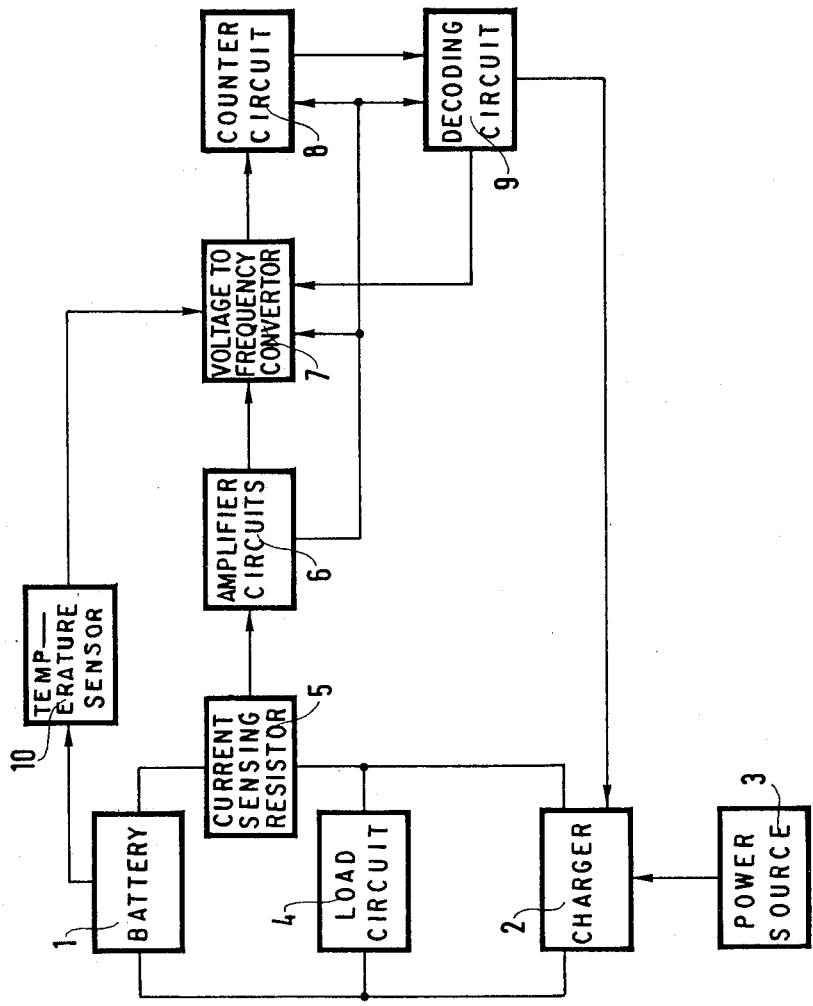
FIG. 1 is a block schematic of a device in accordance with the invention.

FIG. 1 shows a storage battery 1 charged by a charger 2 connected to a power source 3, the battery 1 discharging through the control circuit 4 in the event of failure of the power source 3. The load or discharge current passing through the battery is converted by a unit such as a current sensing resistor 5 to an input voltage proportional to the value of the current flowing through it, the polarity of the input voltage depending on the direction in which the current is flowing. This voltage is amplified in a multi-stage amplifier circuit 6 and the amplified voltage is converted by a voltage to frequency converter 7 into a pulse train at a frequency proportional to the amplified voltage, these pulses being counted by a counting circuit 8. The amplifier circuit 6 produces a signal which is representative of the polarity of the input voltage, and therefore of the direction in which the current passes through the battery. This signal is passed to the counting circuit 8, which is incremented by the pulses or decremented by them, depending on whether the battery is charging or discharging. Thus the logic state at the output of the counting circuit 8 is representative of the state of charge of the battery 1. This information is used by a decoding circuit 9 which responds to an indication that the battery is fully charged by inhibiting rapid charging by the charger 2. The charger can, if required, maintain a trickle charge. The decoding circuit 9 also receives the signal from the amplifier circuit 6 which indicates the direction of current flow, and inhibits the production of pulses by the converter 7 when the output of the circuit 8 indicates that the battery is fully charged and a charging current is being passed through it, or when this output indicates a predetermined state of charge of the battery (which may be the fully discharged state) and a discharge current is passing through the battery. In this way the trickle charge current, which does not alter the state of charge of the battery, does not alter the information representative of that state of charge.

The description of the operation of the system given so far has paid no attention to the fact that the efficiency of charging storage batteries is generally less than 100%, which means that in order to fully charge a completely discharged battery the battery must be supplied with a quantity of electricity greater than its discharge capacity. To take account of the charging efficiency, the coefficient of proportionality of the voltage to frequency converter 7 is varied, depending on whether the battery is charging or discharging. The converter 7 therefore receives from circuit 6 the signal indicating the direction of the current.

It often happens that the charging efficiency varies with the temperature of the battery. When the battery has to operate over a wide temperature range, it is advisable to fit a temperature sensor 10 proximate to or on the battery which provides the converter 7 with a signal representative of the temperature of the battery, so that it can vary the coefficient of proportionality when the battery is on charge.

Referring to FIG. 2a, the circuit diagram includes the battery 1, the charger 2, and the load circuit 4, connected in parallel. In series with the battery 1 is a current sensing resistor 5. The input voltage (across the resistor 5) is fed to the input of a chopper amplifier stage 20 which is part of the multi-stage amplifier circuit 6 of FIG. 1. This amplifier stage includes an analogue gate P1 controlled by an oscillator (not shown) powered by the battery 1.

The oscillator feeds a squarewave signal CP to the gate P1, with alternate amplitudes of 0 and +12 volts. These levels are hereinafter referred to as levels 0 and 1, respectively. This control of the gate P1 converts the input signal into a periodic voltage with an amplitude equal to the absolute value of the input signal and whose phase is shifted by $\pi$ when the polarity of the input voltage changes. The amplifier stage 20 also includes a type 308 amplifier A1 and a filter capacitor C1, providing an amplified alternating voltage whose amplitude is proportional to that of said periodic voltage and which is in phase with the latter. The amplified alternating voltage is applied to a second analogue gate P2 which is controlled by the oscillator via an exclusive-OR gate L1. One input of gate L1 receives the signal CP from the oscillator, and its second input receives a signal UD which has the value 1 when the battery is charging and the value 0 when it is discharging. The generation of this signal UD will be described below. The analogue gate P2 receives the output signal of the gate L1, which is identical to the signal CP when the battery is discharging and to the signal $\overline{CP}$ when the battery is charging. Thus gate P2 operates in synchronism with gate P1 during discharge and in opposition to it during charging, as a result of which it demodulates the amplified alternating voltage to provide a voltage with constant polarity. This is passed through an RC filter F, to produce a d.c. voltage proportional to the amplitude of the amplified alternating voltage, and therefore proportional to the current flowing through the resistor 5.

The signal UD is provided by a discriminator circuit 21 which is also part of the multi-stage amplifier circuit 6 of FIG. 1. The circuit 21 includes a third analogue gate P3 controlled by the signal CP from the oscillator and producing from the amplified alternating voltage a voltage which, after passing through an RC filter F1, consists of a d.c. voltage with the same polarity as the input voltage. This voltage is applied to the input of a type 741 amplifier A2, the output of which is connected through a resistance R1 to the cathode of a diode D1 whose anode is at a zero voltage, i.e., ground. The cathode of the diode D1 is connected through a resistance R2 to the non-inverting (+) input of the amplifier A2. The voltage at this cathode is at level 0 when the amplifier A2 receives a negative input voltage, i.e., when the battery is discharging, and at level 1 when the amplifier input voltage is positive, i.e., when the battery is charging. The voltage at this point forms the signal UD mentioned above. It should be noted that UD is at 0 when no current is passing through the battery, and the significance of this will emerge later.

The device further comprises a second amplifier stage 22, which basically consists of a type 308A amplifier A3, which further amplifies the amplified d.c. voltage provided by the gate P2 of chopper amplifier circuit 20.

The output voltage of the second amplifier stage 22 is applied to a frequency generator K1 based on a type 555 integrated circuit, and which delivers a train of pulses at a frequency $f_o$ proportional to this d.c. voltage and therefore proportional to the current flowing through the battery 1. The coefficient of proportionality relating the frequency $f_o$ to the output voltage of the amplifier stage 22 is set by a frequency control circuit 23 connected to control input #5 of the generator K1. Circuit 23 includes a fourth analogue gate P4 controlled by the signal UD provided by the discriminator circuit 21 in such a way that its output terminal is at zero voltage when the battery is discharging and at a voltage $V_\theta$ when the battery is charging, the voltage $V_\theta$ being supplied to the corresponding input terminal of the gate P4 by a temperature sensor, e.g., 10 FIG. 1 (not shown) in thermal contact with the battery. The voltage $V_\theta$ is representative of the battery temperature. The output of the gate P4 is connected to the non-inverting (+) input of a type 741 amplifier A4 whose output and inverting (−) input are connected via a resistance R3 to terminal 5 of the generator K1. The voltage at this terminal is at a first level, corresponding to a first value of the coefficient of proportionality, when the battery is discharging, and at a second level, corresponding to a second value of this coefficient and the second voltage level varying with the temperature of the battery. The signal $\overline{UD}$ is provided at the inverting output of the gate P4, for reasons which will be explained below.

Figure 2B:
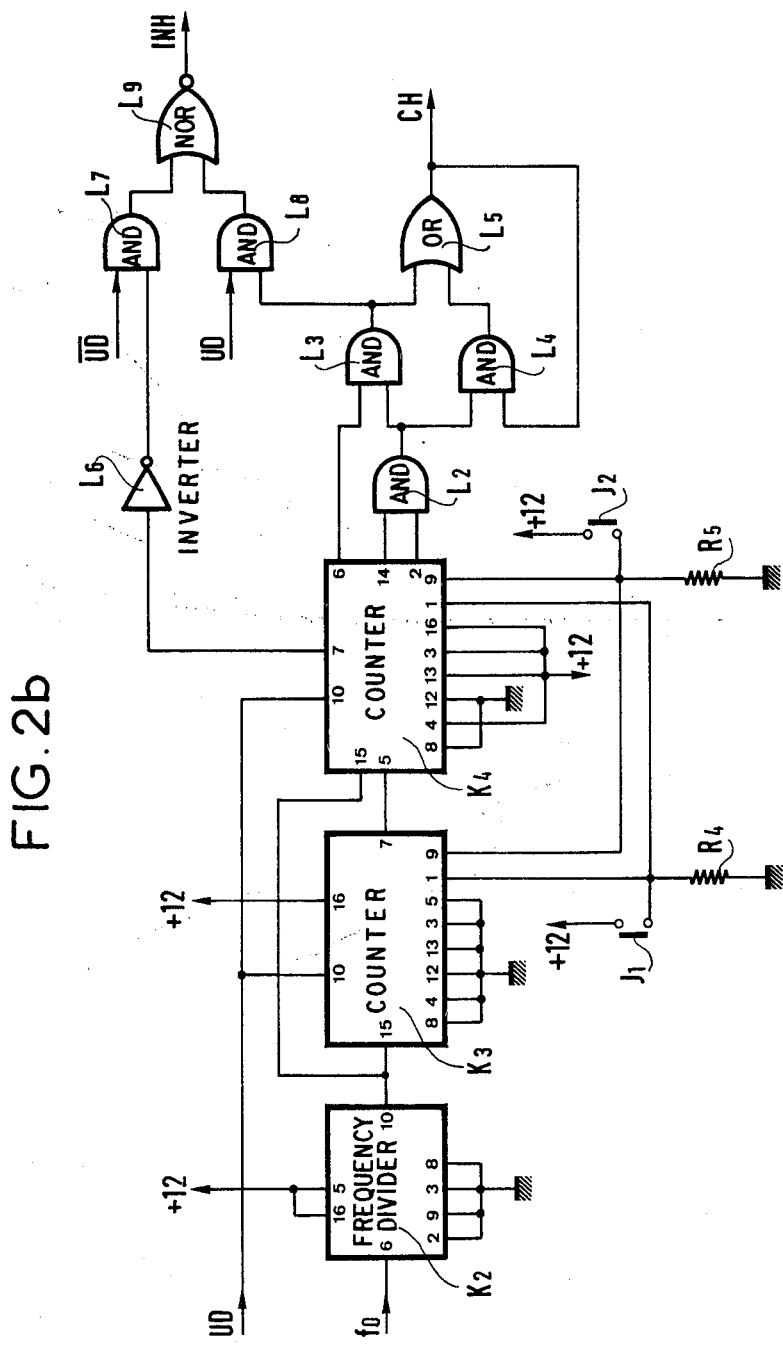

Referring to FIG. 2b, the output terminal 3 of the frequency generator K1 is connected to the input terminal 6 of a type 14 521 frequency divider k2, which therefore receives pulses at the frequency $f_o$ which is representative of the effective charging or discharging current in the battery 1. The divider K2 divides the input frequency by $2^{18}$, in other words, the output signal at output terminal 10 of this divider K2 changes level each time $2^{18}$ pulses are received at the input 6. The change in the level of the output signal therefore occurs at a frequency $2^{-18} f_o$. This output signal is applied to the inputs 15 of two identical type 14 516 counters K3 and K4 which, with the divider K2, make up the counter circuit 8 of FIG. 1. Inputs 4, 12, 13, 3 (preset 1, 2, 3 and 4) and 5 (carry in) of counter K3 and input 12 of counter K4 are at zero or ground voltage, whereas inputs 4, 13 and 3 of counter K4 are at level 1. The preset enable inputs 1 of both counters are connected to voltage level 1 through a normally open manually operated switch J1, and to voltage 0 through a resistance R4. The reset inputs 9 of both counters are similarly connected to the 0 and 1 reference voltage levels through a resistance R5 and a switch J2, respectively. The up/down inputs 10 of counters K3 and K4 receive the signal UD produced by circuit 21 of FIG. 2a, and the carry out output 7 of counter K3 is connected to the carry in input 5 of counter K4. The Q1, Q3 and Q4 outputs 6, 14 and 2 of counter K4, and its output 7 are connected to the decoding circuit 9 of FIG. 1, which includes a number of logic gates. An AND gate L2 has its two inputs respectively connected to outputs 14 and 2 of the counter K4. Another AND gate L3 has its two inputs respectively connected to the output 6 of counter K4 and the output of gate L2. One input of another AND gate L4 is connected to the output of gate L2. The outputs of gates L3 and L4 are connected to respective inputs of an OR gate L5, the output of which is connected to a second input of gate L4. An AND gate L7 has one input connected through an inverter L6 to the output 7 of counter K4, and its other input receives the signal $\overline{UD}$ from the analogue gate P4. A further AND gate L8 has one input connected to the output of gate L3 and the other connected to receive the signal UD. The inputs of a NOR gate L9 are respectively connected to the outputs of gates L7 and L8. The output signal CH of gate L5 controls fast charging of the battery by the charger 2, and the output signal INH of gate L9 is applied to input 4 of generator K1.

Each of counters K3 and K4 has 16 possible logic states, consisting of the 16 binary numbers represented by all possible combinations of the states at outputs Q1 to Q4, from 0000 for the first state to 1111 for the sixteenth. The two counters operate together as a single counter with 256 ($16^2$) states, each of which is represented by an 8-bit number, the first four bits representing the state of counter K4 and the final four bits that of counter K3, this number varying by 1 each time a pulse is received on the counter inputs 15. In the remainder of this description, the 8-bit number represents the logic state E of the counting circuit 8.

Figure 3:
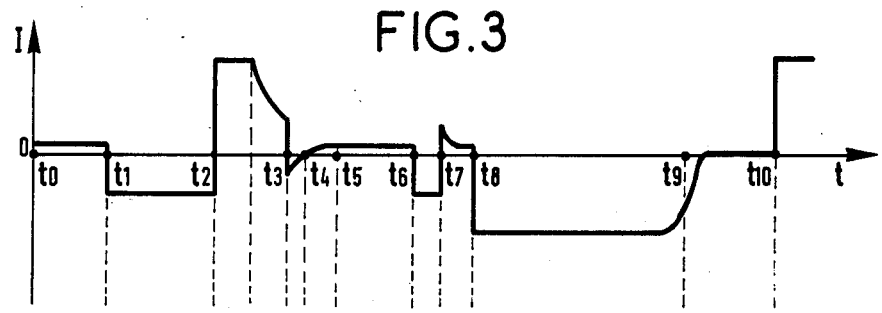
FIGS. 3 to 5 are respective curves showing respectively the variation with time of the current (I) passing through the battery, the voltage (VB) across the battery terminals and the state (E) of the logic output of the counter.
Figure 5:
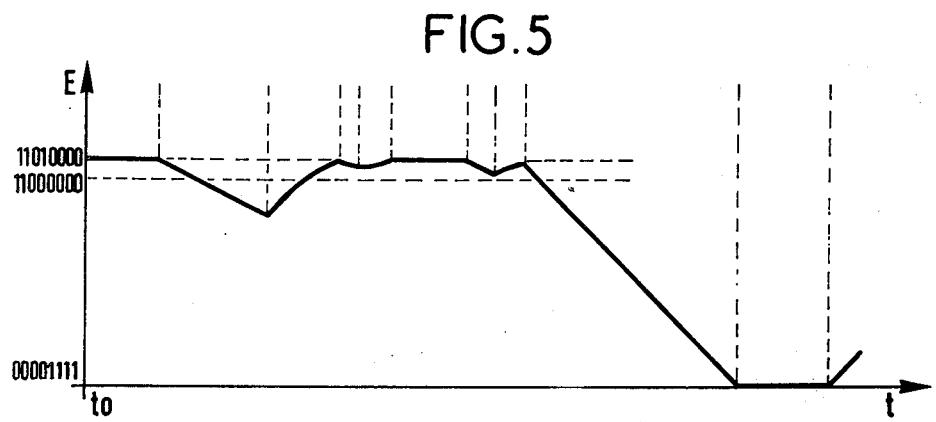

Suppose that at time $t_o$ the battery is completely charged. When switch J1 is operated circuit 8 assumes the state 11010000, which represents the completely charged state of the battery. As long as the power source is operating normally, signal UD is at level 1, and circuit 9 produces a signal CH at level 1, which inhibits rapid charging, and a signal INH at level 0, which inhibits generation of pulses by frequency generator K1. The charger therefore supplies a trickle charge current to the battery, which does not alter the charge state of the battery or the state of the counting circuit which represents this state of charge, as can be seen from FIGS. 3 and 5.

Figure 4:
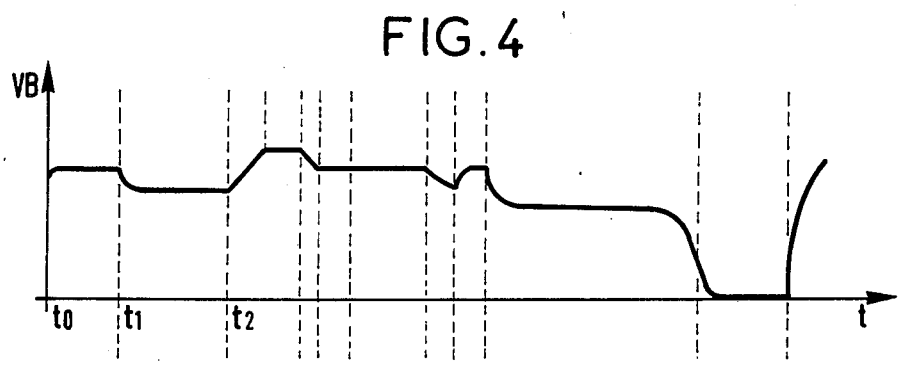

If the power source 3 goes out of service at time $t_1$, the battery must discharge via the load circuit 4, and signal UD goes to 0 and signal INH to 1, which enables the generator K1 to produce pulses. When the divider K2 has received $2^{18}$ pulses, corresponding to the passage through the resistor 5 of a quantity of electricity $q_o$, its output level changes and circuit 8 passes to state 11001111. This process continues, and each time the quantity $q_o$ of electricity is removed from the battery, the state of circuit 8 of K1 changes by 1. If the power source 3 comes back into service at time $t_2$, at which time the battery has been discharged by an amount $m.q_o$, signal UD returns to level 1, and signal CH returns to level 0, provided that the state of counter K4 is less than 1100. The charger therefore supplies a fast charging current to the battery, initially of constant level, but subsequently decreasing to maintain a constant voltage across the battery terminals (see FIG. 4). The charger is of the current limited constant voltage type. The state of circuit 8 varies by 1 each time the generator K1 produces $2^{18}$ pulses, corresponding to a quantity $q'_o$ of electricity, where $q_o = k \cdot q'_o$ and k is the correction factor applied to the coefficient of proportionality of the voltage to frequency converter, set by the voltage $V_\theta$, and equal to the battery charging efficiency at the measured temperature, so that the provision of a charge of $q'_o$ increases the charge in the battery by $q_o$. The battery is completely recharged at time $t_3$, having received a charge of $\Sigma_m q'_o$, the state of circuit 8 being 11010000 once again. At this time signal CH passes to state 1 and the charger provides only a trickle charge. In practice, the drop in battery voltage is not instantaneous (see FIG. 4) and the battery voltage is momentarily higher than the output voltage of the charger, so that the battery discharges to a slight degree through the charger, causing a slight decrease in the state of circuit 8. The drop is not sufficient to produce state 10111111, however, and so does not trip gate L5 to restart fast charging. And so, from time $t_4$, at which the battery voltage is equal to the trickle charge voltage of the charger, the trickle charge current gradually returns the battery to the fully charged state (at time $t_5$), and then ceases to modify the state of charge.

By the same token, if from time $t_6$ to time $t_7$ the battery 1 has to supply the load circuit 4 with a quantity of electrical energy which is too small for the circuit 8 to reach state 10111111, when the power source 3 is reconnected the battery receives only a trickle charge. Fast charging can only be resumed if output Q3 of counter K4 goes to 0. This is to avoid too frequent switching between the fast charging and trickle charging states. If the battery begins to discharge at time $t_8$, and continues to discharge until time $t_9$, when the counting circuit reaches state 00001111, the quantity of electricity discharges is 193 $q_o$. At this time signal INH and the $\overline{\text{carry out}}$ signal of counter K4 go to 0, and the state of circuit 8 no longer varies. This state represents the fully discharged state of the battery, which has a capacity of $C = 193 q_o$. On reconnection of the power source 3, the battery is recharged at the fast charging rate.

It may have been noticed that adopting state 11010000 of circuit 8 as the representation of the fully charged state of the battery means that states 1110 and 1111 of counter K4 are not used. If the latter were at state 1111 when the battery was completely charged, it would only need one spurious pulse to take it to state 0000 corresponding to full discharge, with unfortunate results.

If the system is put into service with the battery completely discharged, switch J2 may be operated to set circuit 8 in a state 00000000. To reach state 11010000 would require a quantity of electricity equal to 208 $q'_o$, representing an excess charge coefficient of 208/193, or approximately 1.078, which in practice is not unduly inconvenient.

The device and its operation as described so far take no account of self-discharge of the battery, i.e., a slow drift into the uncharged state in the absence of any battery current. If the system were not used for some time, the state of charge of the battery would change without the state of the counting circuit 8 following suit, so that the state of this circuit would no longer represent the state of charge of the battery. To overcome this problem, the device shown in FIG. 2a includes means for producing pulses at the output of generator K1 in the absence of battery current. These means include a resistor R6 connected between the inverting (−) input of amplifier A3 and the reference voltage +12 V. The amplifier input is therefore biased, and the amplifier outputs a signal to counter or generator K1 which produces pulses. As signal UD is at 0 when there is no current flowing through the resistor 5, these pulses decrement the counting circuit. The resistance of the resistor R6 is chosen so that the rate at which the state of circuit 8 of K1 varies corresponds to the observed rate of self-discharge of the battery. In practice this frequency is very low, and the voltage reaching the input of amplifier A3 via the resistor R6 is substantially less than that resulting from the amplification by the chopper amplifier stage circuit 20 of the minimum input voltage to which this circuit can respond. The disturbance due to resistor R6 when a current passes through the resistor 5 can therefore be neglected. This recognition of the self-discharge of the battery is possible because of the wide dynamic range at the input of the integrating means used in the system, i.e., the counting circuit.

Although it is essential in carrying out the invention that the fast charge state and the production of pulses corresponding to the charging of the battery be inhibited as soon as the battery is completely charged, it is less vital that the inhibition of the production of pulses corresponding to discharging of the battery coincides with the moment at which the battery becomes completely discharged. In any case, it would be difficult to realize both these conditions at one and the same time, as the capacity C of the battery must be 193 $q_o$, which presupposes calibration of the circuit requiring knowledge of the exact value of the capacity C, which is difficult because of manufacturing variations and because the capacity varies over the life of the battery. In fact, the interruption of the discharge count is intended to prevent counter K4 reaching state 1111 with the battery completely discharged. Generally speaking, the capacity C selected is greater than the maximum quantity $Q_m$ of electricity likely to be consumed by the load circuit 4 during the unavailability of the power source 3. It would then be sufficient to select the value of $q_o$ such that 193 $q_o$ is also greater than $Q_m$, so that the battery is never completely discharged and the state of counter K4 never reaches 0000, so that the state of circuit 8 remains representative of the state of charge of the battery. The problem can arise if the battery is accidentally discharged to the extent that the counter K4 reaches the state 0000, which presupposes that the capacity C is at least equal to 193 $q_o$. The counter would stop at this time, but the battery could continue to discharge, introducing a discrepancy between the state of charge of the battery and the state of circuit 8. On recharging, this could result in the battery being undercharged, having a charged capacity of 193 $q_o$ at the end of the fast charge operation.

The voltages of $+12$ V and $-10$ V used in the circuits of FIGS. 2a and 2b for supplying the integrated circuits and amplifiers, and for other purposes, are supplied by a regulated circuit (not shown) which is itself supplied from the battery 1.

If the battery is to be disconnected for a short while and it is required that its state of charge be memorized, an auxiliary supply may be provided for at least counters K3 and K4, using a small storage cell or battery charged from the battery 1. Outputs Q1 to Q4 of counter K4 may be used to display the state of the counter in some appropriate manner, giving a 13-level indication of the state of charge of the battery. Using the outputs Q1 to Q4 of both counters K3 and K4 provides an indication in terms of 193 levels.

The device described can be modified in various ways within the scope of the claims without departing from the invention. In particular, the two counters K3 and K4 may be replaced with a single counter, or with more than two counters, with any number of levels, depending on the accuracy required in the indication of the state of charge of the battery. The selection of a number N of states suited to the capacity C of the battery (i.e., the satisfying of the equation $C=N \cdot q_o$), can be effected by modifying the value of the resistance of the resistor 5, the voltage amplification ratio, the frequency/voltage coefficient of proportionality, or the frequency division ratio, which is $2^{18}$ in this example, but which can have any value, even 1 (which corresponds to the elimination of the corresponding component).

The integrated circuits, which are commercially available devices, may be replaced with equivalent components, or the association thereof replaced with equivalent associations or components or partially equivalent associations or components, provided that the basic functions of the device as described are included.

It will be understood that the charging current flowing through the resistor 5 must reach a certain threshold value to trip the circuit 21 to provide a signal UD at level 1. It has so far been implicitly assumed that the trickle charge current from the charger 2 is greater than this threshold value. It is possible to conceive of the device operating in other circumstances. But in such a case, the biasing of amplifier A3 by resistance R6 during trickle charging would have to be prevented, as such biasing would be interpreted as an apparent loss of charge (signal UD being at 0), whereas in fact the trickle charge would be maintaining the state of charge. Thus if this bias resistance is to be included in the circuit, it should be switched out of circuit by some suitable means until such time as the power source 3 is not available. It is also possible to use a charger with no trickle charge facility, or to use a constant current charger instead of a constant voltage one. There is no intention therefore of limitation to the exact current and components herein described as variations are contemplated and possible within the scope of the appended claims.

What is claimed is:

1. A device for monitoring the charging and discharging current of a storage battery and for controlling a charger connected to the battery, the device comprising:
    a current sensing resistor adapted to be connected in series with a battery, the voltage across said resistor being proportional to the current through the battery and being referred to hereinafter as the input voltage;
    at least one chopper amplifier stage providing an amplified voltage with an absolute value proportional to said input voltage;
    a voltage to frequency converter providing a train of pulses at a frequency proportional to the absolute value of said amplified voltage;
    a counter responsive to said pulses and to the polarity of the input voltage, the counter being incremented or decremented by said pulses in accordance with the polarity of said input voltage, the state of a logic output of the counter being representative of the state of charge of the battery; and
    a decoding circuit responsive to the logic output state of said counter and adapted to be connected to the charger for limiting the charge rate of said charger to no more than a trickle charge when the counter output state corresponds to full charge of the battery, characterized in that said chopper amplifier state comprises:
    an oscillator;
    a first analog gate controlled by said oscillator and which converts said input voltage into a periodic voltage with an amplitude equal to the absolute value of the input voltage and whose phase is shifted by $\pi$ each time the polarity of the input signal changes;
    an amplifier and associated filter providing an amplified alternating voltage in phase with said periodic voltage and with an amplitude proportional to that of said periodic voltage; and
    a second analog gate controlled by said oscillator converting said amplified alternating voltage into a direct current voltage with an absolute value proportional to the amplitude of said amplified alternating voltage.

2. A device according to claim 1, characterized in that it further comprises means for inverting the control signal of said second analog gate when the polarity of said input voltage changes.

3. A device according to claim 1, characterized in that it further comprises a second amplifier stage between said chopper amplifier stage and said voltage to frequency converter.

4. A device according to claim 3, characterized in that it further comprises a polarity discriminator circuit, said circuit comprising a third analog gate controlled by said oscillator and converting said amplified alternating voltage, after filtering, into a direct current voltage with the same polarity as said input voltage, said discriminator circuit providing a binary signal representative of said polarity.

5. A device according to claim 4, characterized in that it further comprises a frequency control circuit responsive to said binary signal and modifying the coefficient of proportionality of said voltage to said frequency converter in accordance with said polarity.

6. A device according to claim 5, characterized in that said frequency control circuit is controlled by one of two control voltages, depending on said polarity.

7. A device according to claim 6, characterized in that it further includes a temperature sensor, and that the control voltage corresponding to charging of the battery is provided by said temperature sensor which is in thermal contact with the battery.

8. A device for monitoring the charging and discharging current of a storage battery and for controlling a charger connected to the battery, the device comprising:
- a current sensing resistor adapted to be connected in series with a battery, the voltage across said resistor being proportional to the current through the battery and being referred to hereinafter as the input voltage;
- at least one chopper amplifier stage providing an amplified voltage with an absolute value proportional to said input voltage;
- a voltage to frequency converter providing a train of pulses at a frequency proportional to the absolute value of said amplified voltage;
- a counter responsive to said pulses and to the polarity of the input voltage, the counter being incremented or decremented by said pulses in accordance with the polarity of said input voltage, the state of a logic output of the counter being representative of the state of charge of the battery;
- a decoding circuit responsive to the logic output state of said counter and adapted to be connected to the charger for limiting the charge rate of said charger to no more than a trickle charge when the counter output state corresponds to full charge of the battery; and characterized in that it further includes
- means for producing low frequency pulses when no current is passing through the battery.

9. A device according to claim 8, characterized in that said means for producing low frequency pulses comprises a resistor connected between a point in said chopper amplifier stage and a point at a reference potential.

* * * * *